(12) United States Patent
Gangi

(10) Patent No.: US 11,139,395 B2
(45) Date of Patent: Oct. 5, 2021

(54) SEMICONDUCTOR DEVICE

(71) Applicant: KABUSHIKI KAISHA TOSHIBA, Minato-ku (JP)

(72) Inventor: Hiro Gangi, Ota (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 97 days.

(21) Appl. No.: 16/791,544

(22) Filed: Feb. 14, 2020

(65) Prior Publication Data

US 2021/0083098 A1    Mar. 18, 2021

(30) Foreign Application Priority Data

Sep. 13, 2019  (JP) .............................. JP2019-167645

(51) Int. Cl.

| | |
|---|---|
| *H01L 29/78* | (2006.01) |
| *H01L 29/40* | (2006.01) |
| *H01L 29/423* | (2006.01) |
| *H01L 29/10* | (2006.01) |
| *H01L 27/24* | (2006.01) |
| *H01L 29/417* | (2006.01) |

(52) U.S. Cl.
CPC ...... *H01L 29/7813* (2013.01); *H01L 27/2454* (2013.01); *H01L 29/1095* (2013.01); *H01L 29/407* (2013.01); *H01L 29/41766* (2013.01); *H01L 29/4236* (2013.01); *H01L 29/7825* (2013.01); *H01L 29/7827* (2013.01)

(58) Field of Classification Search
CPC ............ H01L 29/7813; H01L 29/7825; H01L 29/4236; H01L 29/402; H01L 29/407; H01L 29/7827; H01L 29/41766; H01L 27/2454

See application file for complete search history.

(56) References Cited

U.S. PATENT DOCUMENTS

| | | |
|---|---|---|
| 5,468,982 A | 11/1995 | Hshieh et al. |
| 5,904,525 A | 5/1999 | Hshieh et al. |

(Continued)

FOREIGN PATENT DOCUMENTS

| | | |
|---|---|---|
| JP | 9-500241 A | 1/1997 |
| JP | 2007-067249 A | 3/2007 |

(Continued)

*Primary Examiner* — Joseph C. Nicely

(74) *Attorney, Agent, or Firm* — Oblon, McClelland, Maier & Neustadt, L.L.P.

(57) ABSTRACT

A semiconductor device according to an embodiment includes: a semiconductor layer including a first trench, a second trench intersecting the first trench, a first semiconductor region of a first conductivity type, a second semiconductor region of a second conductivity type, and a third semiconductor region of the first conductivity type; a gate electrode located in the first trench; a field plate electrode; a metal region located in the second trench and electrically connected to the second semiconductor region; a gate insulating layer located between the gate electrode and the semiconductor layer; a field plate insulating layer located between the field plate electrode and the semiconductor layer; a first electrode electrically connected to the third semiconductor region and the metal region; and a second electrode.

16 Claims, 12 Drawing Sheets

(56) References Cited

U.S. PATENT DOCUMENTS

| | | | | |
|---|---|---|---|---|
| 2012/0286355 A1* | 11/2012 | Mauder | ............... | H01L 29/7393 |
| | | | | 257/330 |
| 2013/0056790 A1 | 3/2013 | Kawamura | | |
| 2013/0062688 A1 | 3/2013 | Kobayashi | | |
| 2014/0097863 A1* | 4/2014 | Zundel | .................... | H01L 22/34 |
| | | | | 324/762.01 |
| 2016/0268420 A1* | 9/2016 | Arai | .................. | H01L 29/66734 |
| 2018/0308943 A1 | 10/2018 | Nishiguchi | | |
| 2019/0081173 A1* | 3/2019 | Nishiwaki | ........... | H01L 29/7811 |
| 2019/0123193 A1* | 4/2019 | Mauder | ............. | H01L 21/26506 |
| 2020/0212219 A1* | 7/2020 | Kim | ...................... | H01L 29/872 |
| 2020/0295181 A1* | 9/2020 | Shimomura | ........ | H01L 29/7813 |

FOREIGN PATENT DOCUMENTS

| | | | |
|---|---|---|---|
| JP | 2008-199048 A | 8/2008 | |
| JP | 2013-58575 A | 3/2013 | |
| JP | 2013-62344 A | 4/2013 | |
| JP | 2018-182258 A | 11/2018 | |

\* cited by examiner

SEMICONDUCTOR DEVICE

CROSS-REFERENCE TO RELATED APPLICATION

This application is based upon and claims the benefit of priority from Japanese Patent Application No. 2019-167645, filed on Sep. 13, 2019, the entire contents of which are incorporated herein by reference.

FIELD

Embodiments described herein relate generally to semiconductor devices.

BACKGROUND

In order to reduce the size of the transistor or to improve the performance of the transistor, a vertical type transistor where a gate electrode is buried in a trench is used. In the vertical type transistor, the drain-source breakdown voltage (hereinafter, simply denoted as a "breakdown voltage") and the on-resistance has a trade-off relationship. That is, if the impurity concentration of the drift region is increased in order to reduce the on-resistance, the breakdown voltage is decreased. On the contrary, if the impurity concentration of the drift region is decreased in order to improve the breakdown voltage, the on-resistance is increased.

As a method of improving the trade-off of the breakdown voltage and the on-resistance, there is a structure in which a field plate electrode is provided in a trench of a vertical type transistor. By changing the electric field distribution in the drift region by using the field plate electrode, for example, while the breakdown voltage is maintained, the impurity concentration of the drift region can be increased. Therefore, while the breakdown voltage is maintained, it is possible to reduce the on-resistance.

DETAILED DESCRIPTION

Figure 1:
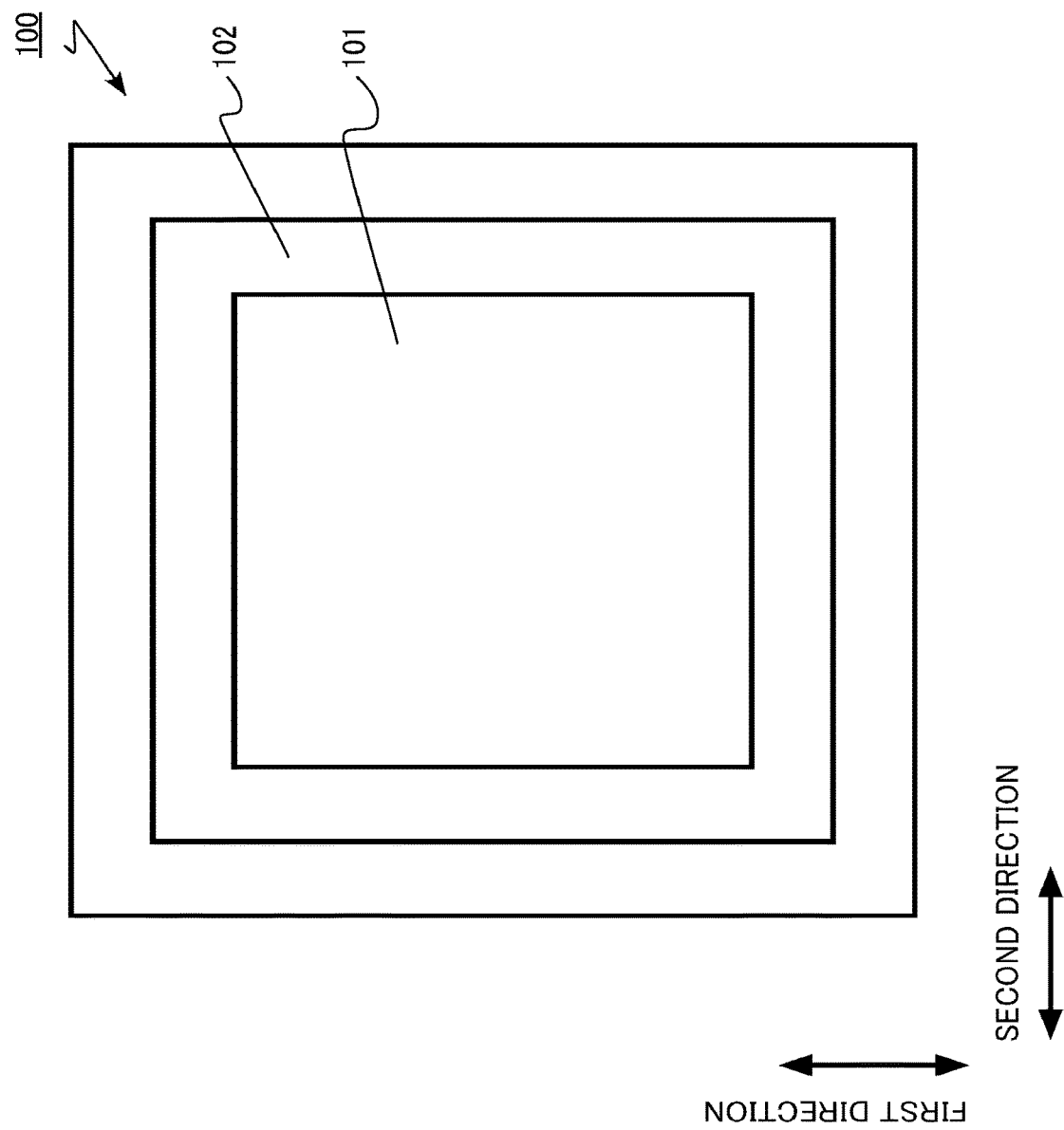
FIG. 1 is a schematic plan view of a semiconductor device according to a first embodiment.

A semiconductor device according to an embodiment includes: a semiconductor layer having a first plane and a second plane facing the first plane, the semiconductor layer including a first trench located on a side closer to the first plane and extending in a first direction on the first plane, a second trench located on the side closer to the first plane, extending in a second direction perpendicular to the first direction, and intersecting the first trench, a first semiconductor region of a first conductivity type, a second semiconductor region of a second conductivity type located between the first semiconductor region and the first plane, and a third semiconductor region of the first conductivity type located between the second semiconductor region and the first plane; a gate electrode located in the first trench; a field plate electrode located between the gate electrode and the second plane in the first trench; a metal region located in the second trench and electrically connected to the second semiconductor region; a gate insulating layer located between the gate electrode and the semiconductor layer; a field plate insulating layer located between the field plate electrode and the semiconductor layer; a first electrode located on the side closer to the first plane and electrically connected to the third semiconductor region and the metal region; and a second electrode located on a side closer to the second plane of the semiconductor layer.

Hereinafter, embodiments will be described with reference to the drawings. In addition, in the following description, the same or similar members are denoted by the same reference numerals, and the description of the members or the like that have been described once is omitted as appropriate.

In addition, in the following description, the notations $n^+$, n, $n^-$ and $p^+$, p, $p^-$ represent the relative levels of the impurity concentrations in the respective conductivity types. That is, $n^+$ represents to be relatively higher in the n-type impurity concentration than n, and $n^-$ represents to be relatively lower in the n-type impurity concentration than n. In addition, $p^+$ represents to be relatively higher in the p-type impurity concentration than p, and $p^-$ represents to be relatively lower in the p-type impurity concentration than p. In addition, in some cases, the $n^+$-type and the $n^-$-type may be simply referred to as the n-type and the $p^+$-type and $p^-$-type may be simply referred to as the p-type.

The impurity concentration can be measured by, for example, secondary ion mass spectrometry (SIMS). In addition, the relative level of the impurity concentration can be determined from the level of the carrier concentration obtained by, for example, scanning capacitance microscopy (SCM). In addition, the distance such as the width and depth of the impurity region can be obtained by, for example, SIMS. In addition, the distance such as the width and depth of the impurity region can be obtained from, for example, an SCM image.

The depth of the trench, the thickness of the insulating layer, and the like can be measured on images of, for example, an SIMS and a transmission electron microscope (TEM).

First Embodiment

A semiconductor device according to a first embodiment includes: a semiconductor layer having a first plane and a second plane facing the first plane, the semiconductor layer including a first trench located on a side closer to the first plane and extending in a first direction on the first plane, a second trench located on the side closer to the first plane, extending in a second direction perpendicular to the first direction, and intersecting the first trench, a first semiconductor region of a first conductivity type, a second semiconductor region of a second conductivity type located between the first semiconductor region and the first plane, and a third semiconductor region of the first conductivity type located between the second semiconductor region and the first plane; a gate electrode located in the first trench; a field plate electrode located between the gate electrode and the second plane in the first trench; a metal region located in the second trench and electrically connected to the second semiconductor region; a gate insulating layer located between the gate electrode and the semiconductor layer; a field plate insulating layer located between the field plate electrode and the semiconductor layer; a first electrode located on the side closer to the first plane and electrically connected to the third semiconductor region and the metal region; and a second electrode located on a side closer to the second plane of the semiconductor layer.

The semiconductor device according to the first embodiment is a vertical type transistor where a gate electrode is buried in a trench. The semiconductor device according to the first embodiment is a vertical type power metal oxide semiconductor field effect transistor (the MOSFET). The semiconductor device according to the first embodiment is a MOSFET 100.

Hereinafter, a case where the first conductivity type is n-type and the second conductivity type is p-type, that is, the case of an n-channel the MOSFET in which electrons are used as carriers is described as an example.

FIG. 1 is a schematic plan view of the semiconductor device according to the first embodiment. The MOSFET 100 according to the first embodiment has an active region 101 and a termination region 102. The active region 101 is surrounded by the termination region 102.

The active region 101 functions as a region through which current flows during the time of on-operation of the MOSFET 100. The termination region 102 functions as a region for relaxing a strength of an electric field applied to an end portion of active region 101 during the time of off-operation of the MOSFET 100 and improving a breakdown voltage of the MOSFET 100.

Figure 2:
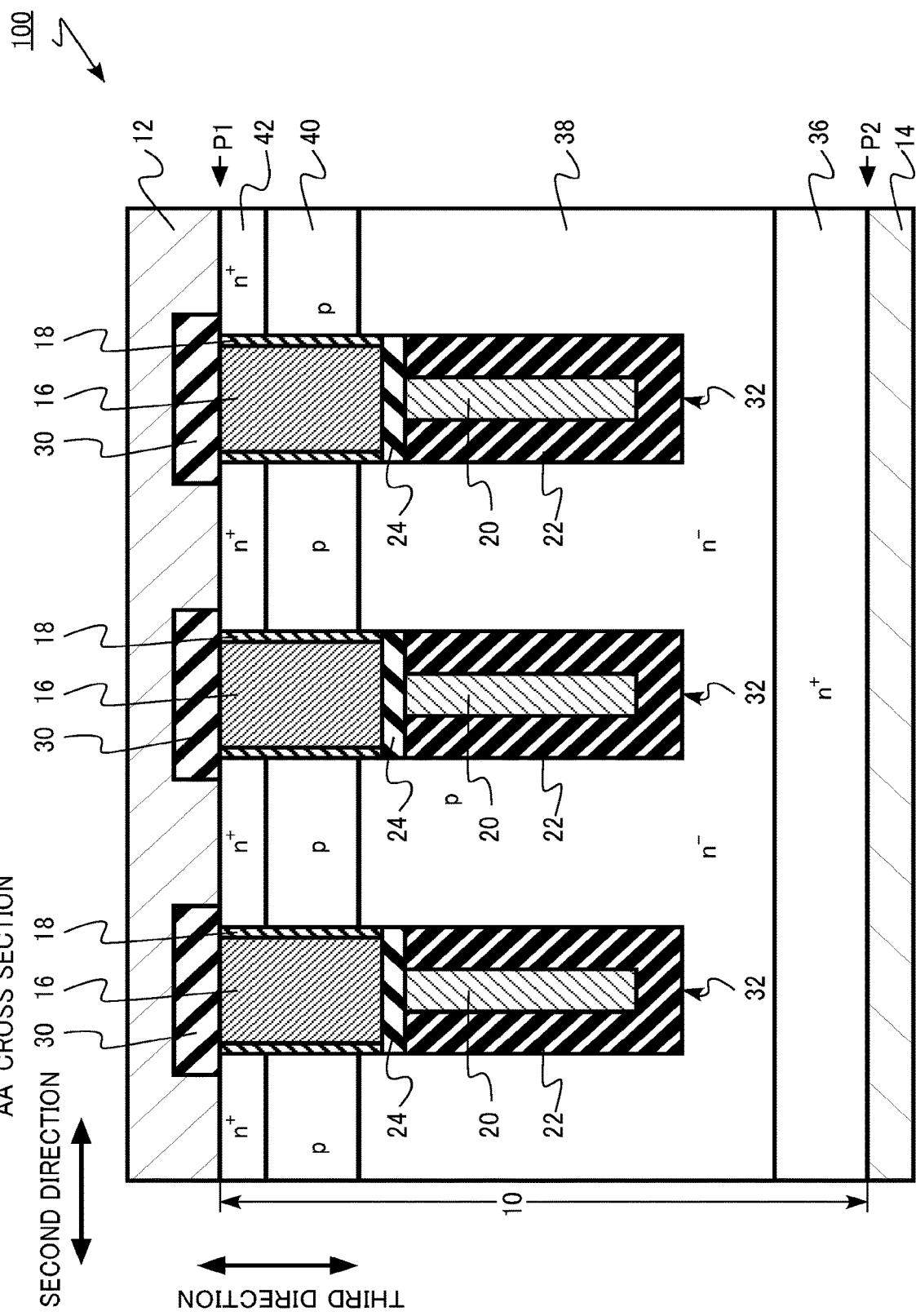
FIG. 2 is a schematic cross-sectional view of the semiconductor device according to the first embodiment.
Figure 3:
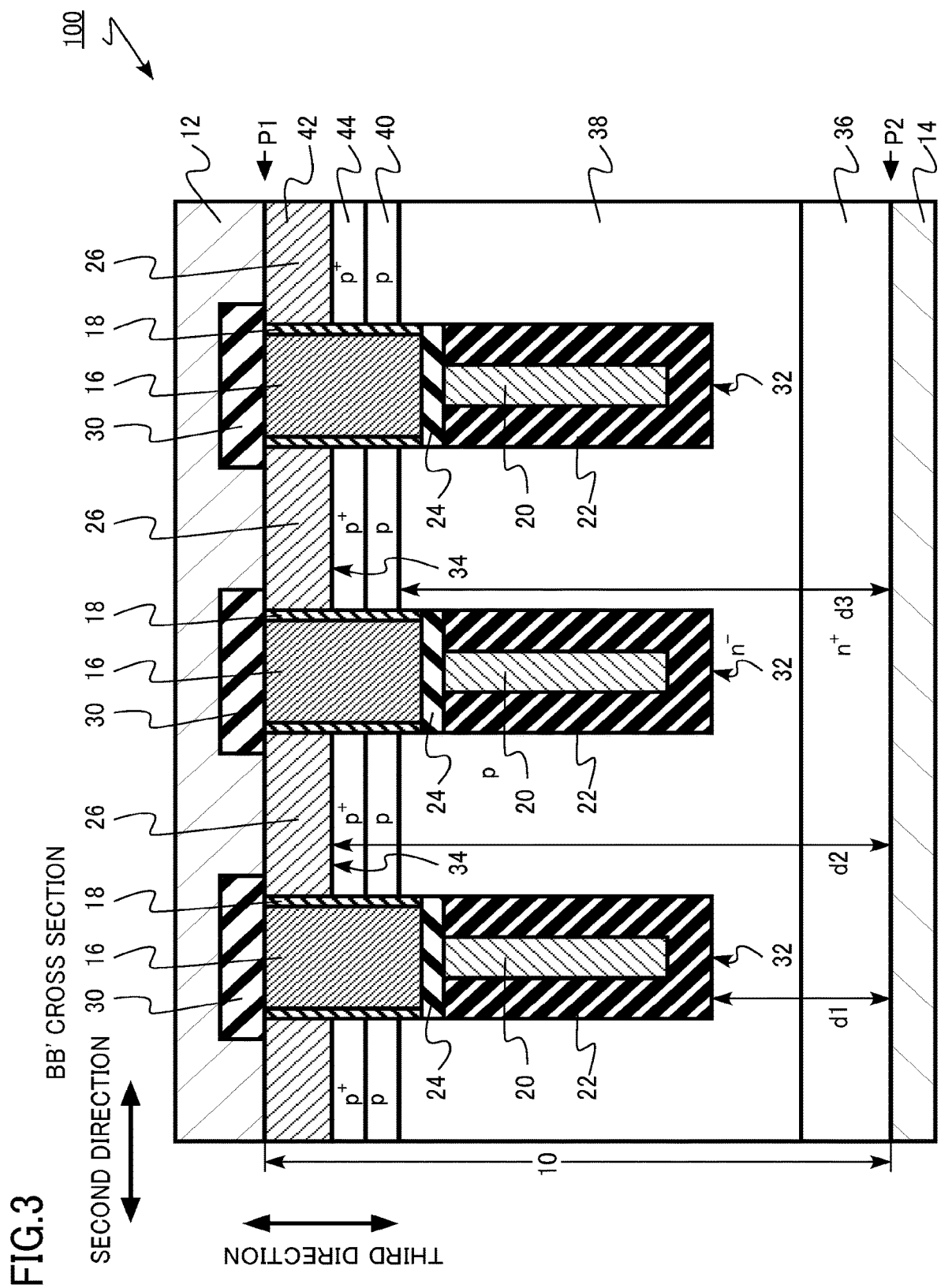
FIG. 3 is a schematic cross-sectional view of the semiconductor device according to the first embodiment.
Figure 4:
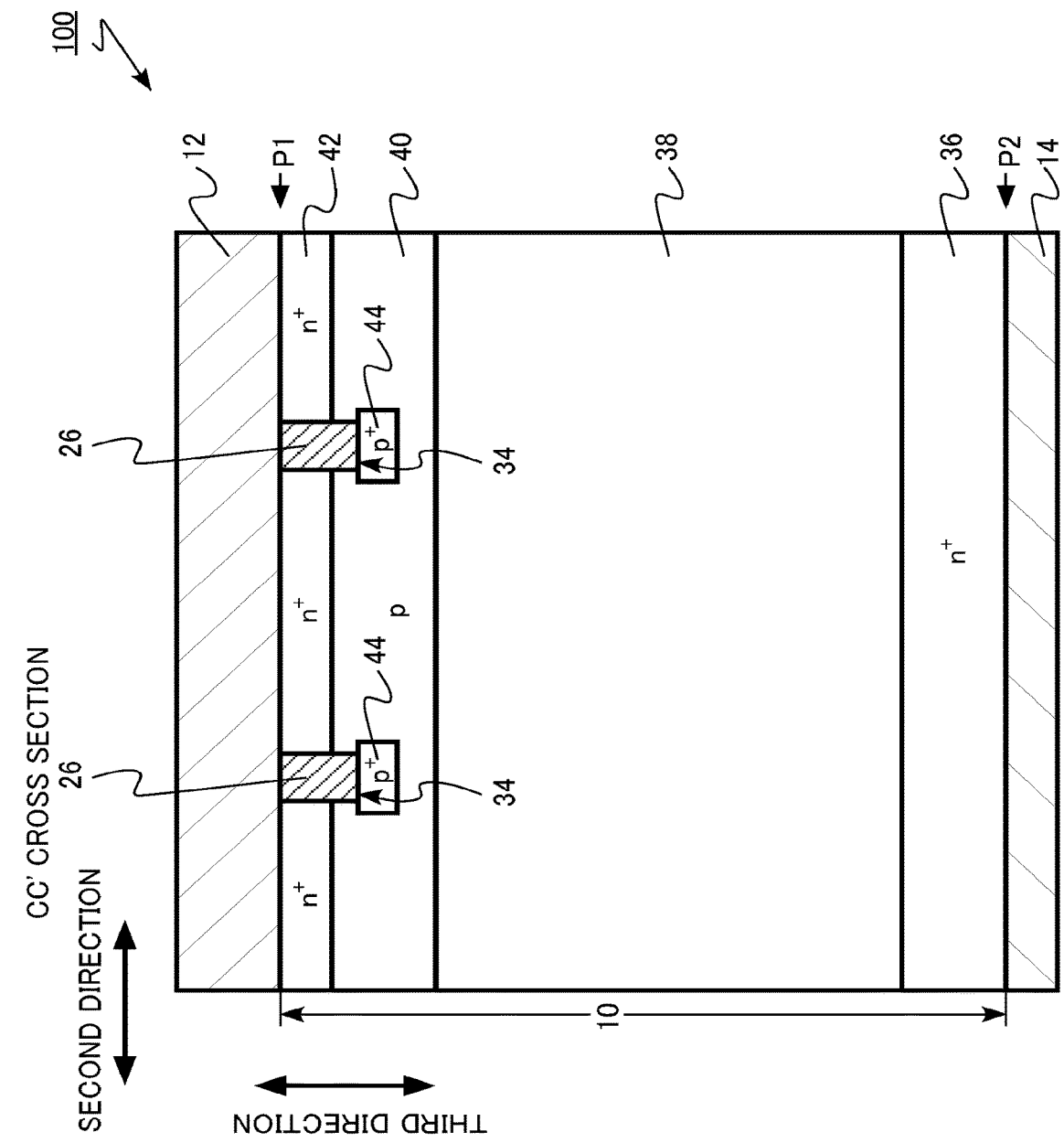
FIG. 4 is a schematic cross-sectional view of the semiconductor device according to the first embodiment.

FIGS. 2, 3, and 4 are schematic cross-sectional views of the semiconductor device according to the first embodiment. FIGS. 2, 3, and 4 are cross-sectional views of a portion of the active region 101 of the MOSFET 100. FIG. 2 is a cross-sectional view taken along line AA' of FIG. 5. FIG. 3 is a cross-sectional view taken along line BB' of FIG. 5. FIG. 4 is a cross-sectional view taken along line CC' of FIG. 5.

Figure 5:
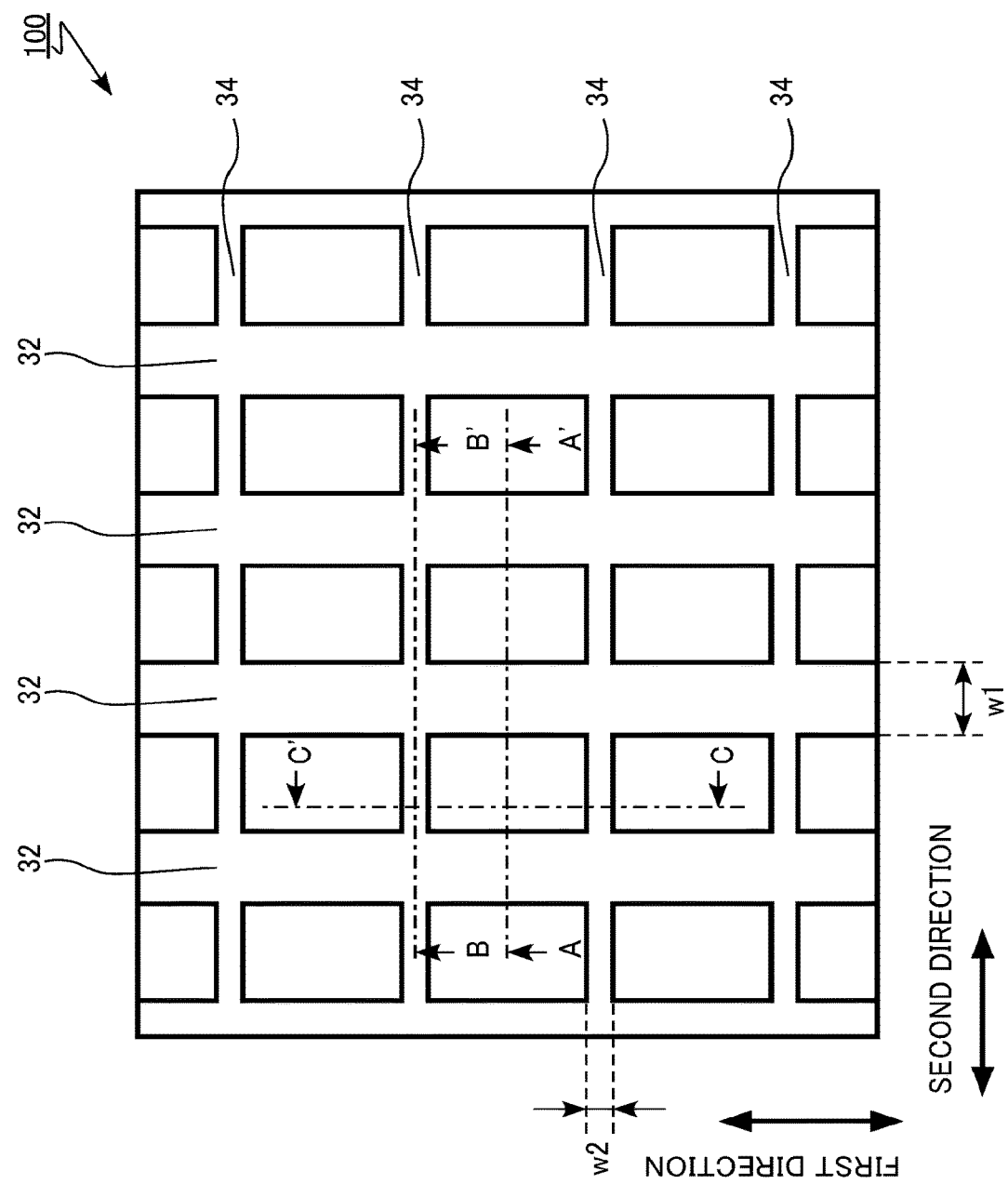
FIG. 5 is a schematic plan view of the semiconductor device according to the first embodiment.
Figure 6:
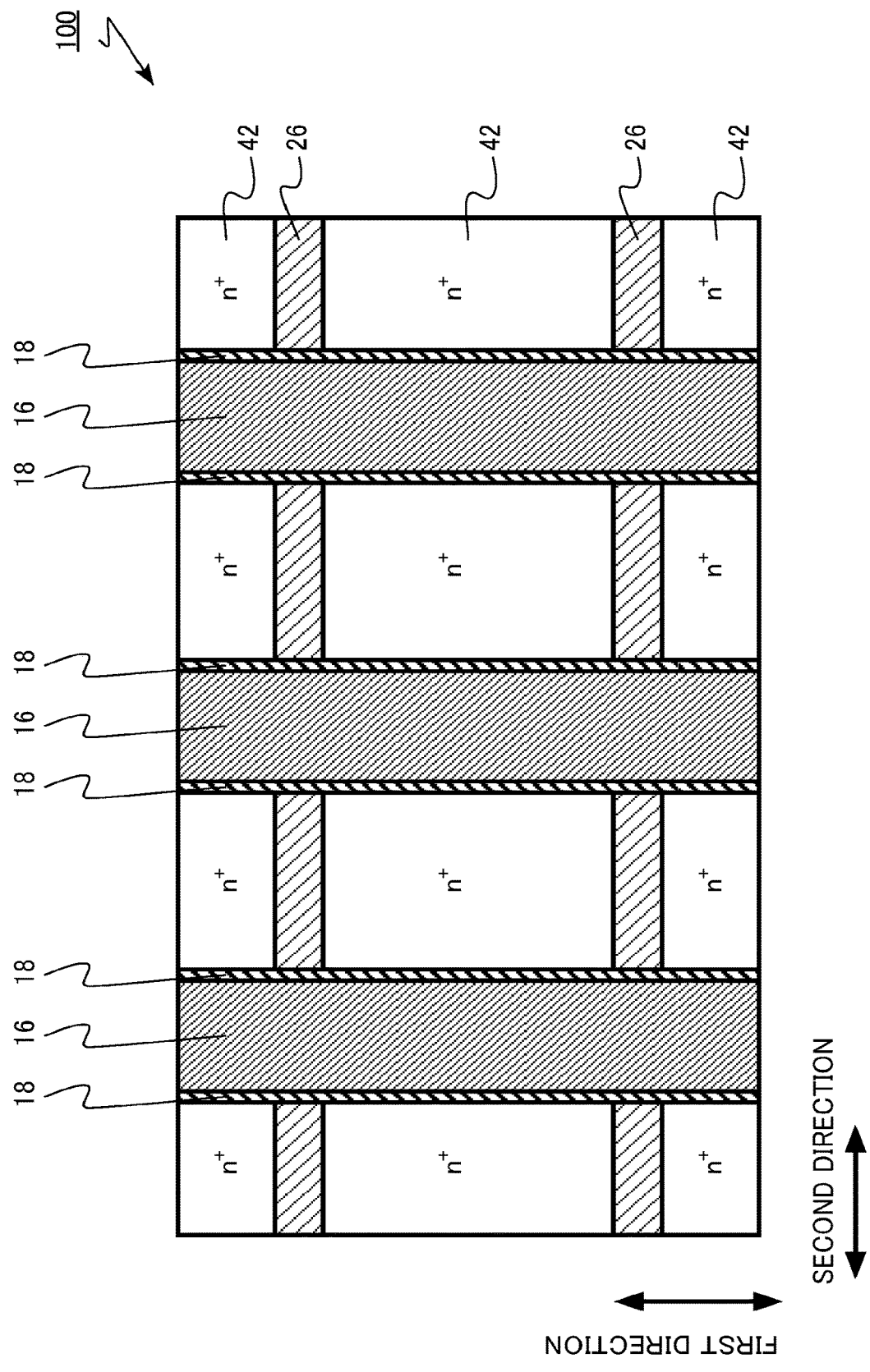
FIG. 6 is a schematic plan view of the semiconductor device according to the first embodiment.

FIGS. 5 and 6 are schematic plan views of the semiconductor device according to the first embodiment. FIGS. 5 and 6 are plan views of a portion of the active region 101 of the MOSFET 100. FIGS. 5 and 6 are plan views of the first plane (P1 in FIG. 2) of FIG. 2. FIG. 5 illustrates only a trench pattern on the first plane P1. FIG. 6 illustrates a pattern of the MOSFET 100 on the first plane P1.

The MOSFET 100 includes a silicon layer 10 (semiconductor layer), a source electrode 12 (first electrode), a drain electrode 14 (second electrode), a gate electrode 16, a gate insulating layer 18, a field plate electrode 20, a field plate insulating layer 22, an intermediate insulating layer 24, a contact electrode 26 (metal region), and an interlayer insulating layer 30.

The silicon layer 10 includes a gate trench 32 (first trench), a contact trench 34 (second trench), an n$^+$-type drain region 36, an n$^-$-type drift region 38 (first semiconductor region), a p-type body region 40 (second semiconductor region), an n$^+$-type source region 42 (third semiconductor region), and a p$^+$-type contact region 44 (fourth semiconductor region).

The silicon layer 10 is located between the source electrode 12 and the drain electrode 14. The silicon layer 10 includes a first plane ("P1" in FIG. 2) and a second plane ("P2" in FIG. 2). Hereinafter, the first plane P1 is also referred to as a front surface, and the second plane P2 is also referred to as a back surface. The second plane P2 faces the first plane P1.

The first direction and the second direction are directions parallel to the first plane P1. The second direction is a direction intersecting the first direction. The second direction is a direction perpendicular to the first direction. In addition, a third direction is a direction perpendicular to the first plane. The third direction is a direction perpendicular to the first direction and the second direction.

Hereinafter, the term "depth" denotes a depth based on the first plane P1. That is, the depth denotes a distance in the third direction based on the first plane P1.

The silicon layer 10 is made of single crystal silicon (Si). The front surface of the silicon layer 10 is, for example, a surface inclined by 0 degrees or more and 8 degrees or less with respect to the (100) plane.

The n$^+$-type drain region 36 is provided in the silicon layer 10. The drain region 36 contains n-type impurities. The n-type impurity is, for example, phosphorus (P) or arsenic (As). The n-type impurity concentration is, for example, $1\times10^{18}$ cm$^{-3}$ or more and $1\times10^{21}$ cm$^{-3}$ or less.

The n$^-$-type drift region 38 is provided in the silicon layer 10. The drift region 38 is provided between the drain region 36 and the first plane P1. The drift region 38 is provided on the drain region 36.

The drift region 38 contains n-type impurities. The n-type impurity is, for example, phosphorus (P) or arsenic (As). The n-type impurity concentration is, for example, $1\times10^{15}$ cm$^{-3}$ or more and $1\times10^{21}$ cm$^{-3}$ or less. The drift region 38 is, for example, an epitaxial growth layer formed by epitaxial growth on the n$^+$-type drain region 36.

The thickness of the drift region 38 in the third direction is, for example, 7 μm or more and 15 μm or less.

The p-type body region 40 is provided in the silicon layer 10. The body region 40 is provided between the drift region 38 and the first plane P1. During the time of on-operation of the MOSFET 100, a channel is formed in a region which is in contact with the gate insulating layer 18.

The body region 40 contains p-type impurities. The p-type impurity is, for example, boron (B). The p-type impurity concentration is, for example, $1\times10^{16}$ cm$^{-3}$ or more and $1\times10^{18}$ cm$^{-3}$ or less.

The n$^+$-type source region 42 is provided in the silicon layer 10. The source region 42 is provided between the body region 40 and the first plane P1.

The source region 42 contains n-type impurities. The n-type impurity is, for example, phosphorus (P) or arsenic (As). The n-type impurity concentration is, for example, $1\times10^{19}$ cm$^{-3}$ or more and $1\times10^{21}$ cm$^{-3}$ or less.

The p$^+$-type contact region 44 is provided in the silicon layer 10. The contact region 44 is provided between the body region 40 and the contact trench 34.

The contact region 44 is in contact with the contact electrode 26 in the bottom of the contact trench 34. The contact region 44 is in contact with the gate insulating layer 18.

The contact region 44 contains p-type impurities. The p-type impurity is, for example, boron (B). The p-type impurity concentration is, for example, $1\times10^{19}$ cm$^{-3}$ or more and $1\times10^{21}$ cm$^{-3}$ or less.

The p-type impurity concentration of the contact region 44 is higher than the p-type impurity concentration of the body region 40. By increasing the p-type impurity concentration, the contact resistance between the contact electrode 26 and the contact region 44 is reduced.

The gate trench 32 exists in the silicon layer 10. The gate trench 32 is located on the side of the silicon layer 10 closer to the first plane P1. The gate trench 32 is a groove formed in the silicon layer 10.

The gate trench 32 penetrates the body region 40 and reaches the drift region 38. The depth of the gate trench 32 is, for example, 4 µm or more and 6 µm or less.

The contact trench 34 exists in the silicon layer 10. The contact trench 34 is located on the side of the silicon layer 10 closer to the first plane P1. The contact trench 34 is a groove formed in the silicon layer 10.

The depth of the contact trench 34 is smaller than the depth of the gate trench 32. A first distance (d1 in FIG. 3) from the second plane to the gate trench 32 is smaller than a second distance (d2 in FIG. 3) from the second plane to the contact trench 34.

The contact trench 34 is shallower than the body region 40. The second distance (d2 in FIG. 3) is larger than a third distance (d3 in FIG. 3) from the second plane to the body region 40.

As illustrated in FIG. 5, the gate trench 32 extends in the first direction on the first plane P1. The gate trench 32 is repeatedly disposed at a constant pitch in the second direction. The repetition pitch of the gate trenches 32 is, for example, 1 µm or more and 5 µm or less.

As illustrated in FIG. 5, the contact trench 34 extends in the second direction on the first plane P1. The contact trenches 34 are repeatedly disposed at a constant pitch in the first direction. The contact trench 34 intersects the gate trench 32.

The first width (w1 in FIG. 5) of the gate trench 32 in the second direction is larger than the second width (w2 in FIG. 5) of the contact trench 34 in the first direction. The first width w1 is, for example, 2 times or more and 5 times or less of the second width w2.

The gate electrode 16 is provided in the gate trench 32. The gate electrode 16 is made of, for example, polycrystalline silicon containing an n-type impurity or a p-type impurity.

The gate insulating layer 18 is provided between the gate electrode 16 and the silicon layer 10. The gate insulating layer 18 is provided between the gate electrode 16 and the body region 40. The gate insulating layer 18 is provided between the gate electrode 16 and the drift region 38. The gate insulating layer 18 is provided between the gate electrode 16 and the source region 42. The gate insulating layer 18 is provided between the gate electrode 16 and the contact electrode 26. The gate insulating layer 18 is made of, for example, silicon oxide.

The field plate electrode 20 is provided in the gate trench 32. The field plate electrode 20 is provided between the gate electrode 16 and the second plane P2. The field plate electrode 20 is made of, for example, polycrystalline silicon containing an n-type impurity or a p-type impurity.

The field plate electrode 20 extends in the first direction.

The field plate electrode 20 has a function of changing the electric field distribution in the drift region 38 and improving the breakdown voltage of the MOSFET 100 during the time of off-operation of the MOSFET 100.

The field plate insulating layer 22 is provided between the field plate electrode 20 and the silicon layer 10. The field plate insulating layer 22 is provided between the field plate electrode 20 and the drift region 38. The field plate insulating layer 22 is made of, for example, silicon oxide.

The thickness of the field plate insulating layer 22 is larger than, for example, the thickness of the gate insulating layer 18. The thickness of the field plate insulating layer 22 is, for example, 5 times or more and 30 times or less of the thickness of the gate insulating layer 18.

The intermediate insulating layer 24 is provided between the gate electrode 16 and the field plate electrode 20. The intermediate insulating layer 24 has a function of electrically separating the gate electrode 16 from the field plate electrode 20.

The contact electrode 26 is provided in the contact trench 34. The contact electrode 26 is in contact with the contact region 44 on the bottom surface of the contact trench 34. The contact electrode 26 is in contact with the source region 42 on side surface of the contact trench 34. The contact electrode 26 is electrically connected to the source electrode 12. The contact electrode 26 is in contact with, for example, the source electrode 12.

The contact electrode 26 extends in the second direction on the first plane P1. The contact electrode 26 intersects the gate electrode 16 on the first plane P1.

The contact electrode 26 has a function of electrically connecting the source electrode 12 and the body region 40.

The contact electrode 26 is made of a metal. The contact electrode 26 is made of, for example, tungsten, titanium, titanium nitride, or aluminum.

In addition, the contact electrode 26 can be formed simultaneously with the source electrode 12. In this case, for example, contact electrode 26 and the source electrode 12 are made of consecutive identical materials. In this case, the contact electrode 26 is a portion of the source electrode 12.

The interlayer insulating layer 30 is provided between the gate electrode 16 and the source electrode 12. The interlayer insulating layer 30 has a function of electrically separating the gate electrode 16 from the source electrode 12. The interlayer insulating layer 30 is made of, for example, silicon oxide.

The source electrode 12 is provided on the side of the silicon layer 10 closer to the first plane P1. The source electrode 12 is provided on the first plane P1 of the silicon layer 10. The source electrode 12 is electrically connected to the source region 42 and the body region 40. The source electrode 12 is in contact with the source region 42.

The source electrode 12 is electrically connected to the field plate electrode 20 by using a contact structure (not illustrated).

The source electrode 12 is a metal electrode. The source electrode 12 is, for example, a stacked film of titanium (Ti) and aluminum (Al).

The drain electrode 14 is provided on the side of the silicon layer 10 closer to the second plane P2. The drain electrode 14 is provided on the second plane P2 of the silicon layer 10. The drain electrode 14 is electrically connected to the drain region 36. The drain electrode 14 is in contact with the drain region 36.

The drain electrode 14 is a metal electrode. The drain electrode 14 is a stacked film made of, for example, titanium (Ti), aluminum (Al), nickel (Ni), copper (Cu), silver (Ag), gold (Au), and the like.

Hereinafter, the function and effect of the semiconductor device according to the first embodiment will be described.

Figure 7:
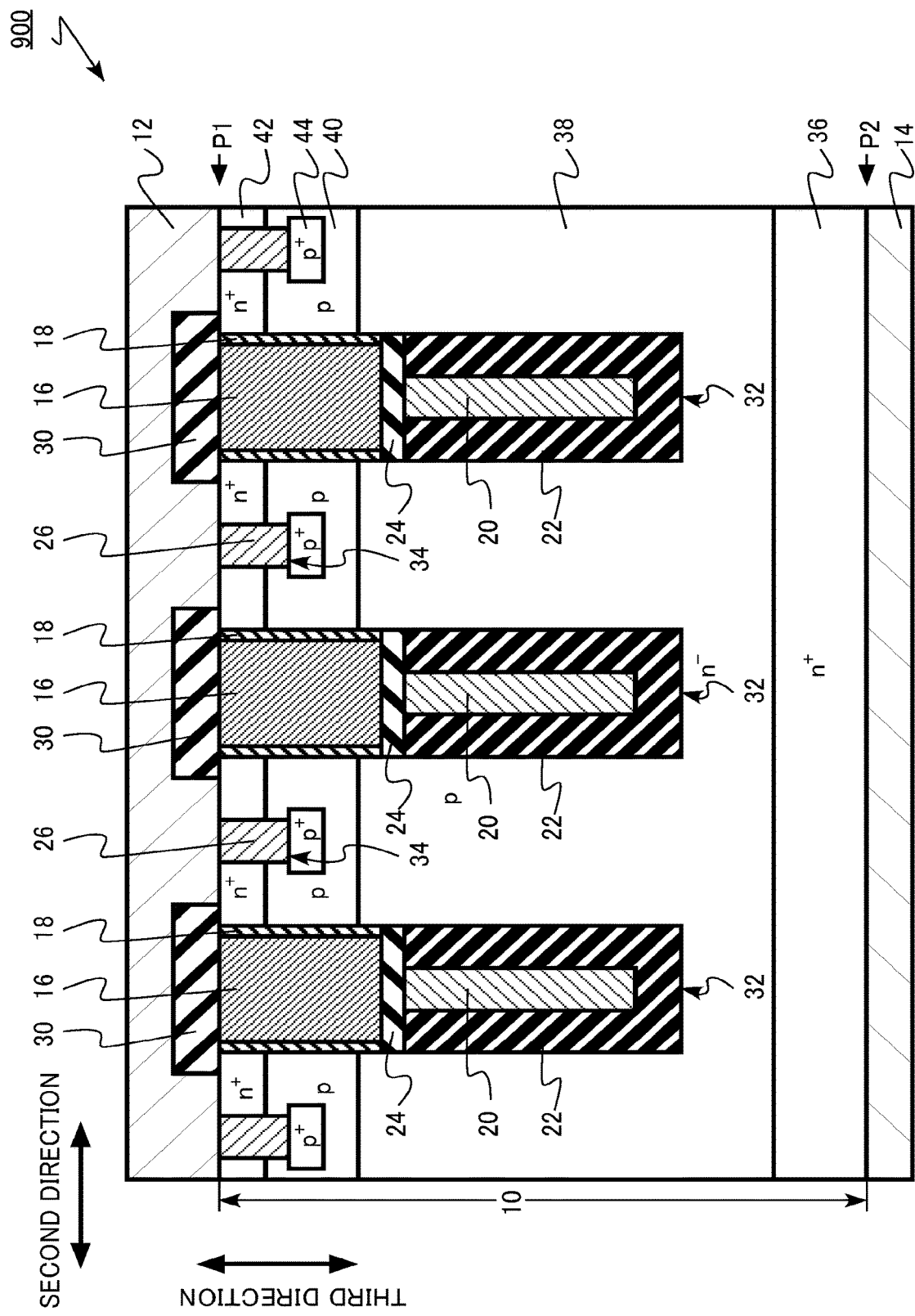
FIG. 7 is a schematic cross-sectional view of a semiconductor device according to Comparative Example.

FIG. 7 is a schematic cross-sectional view of a semiconductor device according to Comparative Example. The semiconductor device according to Comparative Example is a vertical type transistor where a gate electrode is buried in a trench. The semiconductor device according to Comparative Example is a MOSFET 900. FIG. 7 is a view according to FIG. 2 of the first embodiment.

The MOSFET 900 is different from the MOSFET 100 according to the first embodiment from the point of view that, in the MOSFET 900, the contact trench 34 is provided between the gate trenches 32 and extends parallel to the gate trench 32 in the first direction.

In the vertical type transistor, the breakdown voltage and the on-resistance have a trade-off relationship. That is, if the impurity concentration of the drift region is increased in order to reduce the on-resistance, the breakdown voltage is decreased. On the contrary, if the impurity concentration of the drift region is decreased in order to improve the breakdown voltage, the on-resistance is increased.

In the MOSFET 900, in order to improve the trade-off between the breakdown voltage and the on-resistance, the field plate electrode 20 is provided in the gate trench 32. By changing the electric field distribution in the drift region 38 by using the field plate electrode 20, for example, while the breakdown voltage is maintained, the n-type impurity concentration of drift region 38 can be increased. Therefore, while the breakdown voltage is maintained, it is possible to reduce the on-resistance.

Furthermore, in order to reduce the on-resistance, it is considered that, for example, the repetition pitch of the gate trenches 32 in the second direction is reduced. That is, it is considered that the distance between the two gate trenches 32 adjacent to each other is reduced. By reducing the distance between the two gate trenches 32 adjacent to each other, the depletion of the drift region 38 between the two gate trenches 32 is further easily performed. Therefore, it is possible to further increase the n-type impurity concentration of the drift region 38.

However, in the MOSFET 900, the contact trench 34 is provided between the two gate trenches 32 adjacent to each other in the second direction. The contact region 44 having a high p-type impurity concentration exists in the bottom of the contact trench 34. For example, when the distance between the gate trench 32 and the contact trench 34 becomes small, the p-type impurity concentration of the body region 40 facing the gate electrode 16 is increased due to the p-type impurity of the contact region 44, and thus, there is a concern that the threshold voltage of the MOSFET 900 is increased.

In the MOSFET 900, when the pitch of the gate trenches 32 is reduced, for example, due to the misalignment in the lithography process, the distance between the gate trench 32 and the contact region 44 is varied. Therefore, the threshold voltage for each product is varied, which causes a problem. Accordingly, in the MOSFET 900, it is difficult to reduce the pitch of the gate trenches 32.

In addition, the contact region 44 also functions as a low-resistant passage through which generated holes are released to the source electrode 12 when the avalanche breakdown occurs. The avalanche breakdown is likely to occur in the vicinity of the gate trench 32. Therefore, if the gate trench 32 and the contact region 44 are separated from each other by the misalignment in the lithography process, there is a concern that the avalanche resistance amount is lowered.

Therefore, in the MOSFET 900, there is a concern that the avalanche resistance amount is varied by the misalignment in the lithography process.

In the MOSFET 100 according to the first embodiment, the contact trench 34 is disposed in a direction perpendicular to the gate trench 32. Therefore, even if misalignment occurs in the lithography process, a relative position relationship between the contact region 44 and the gate trench 32 is not varied. Therefore, it is possible to reduce the pitch of the gate trench 32. Accordingly, it is possible to further reduce the on-resistance as compared with the MOSFET 900. In addition, it is possible to suppress variation in avalanche resistance amount.

As described above, according to the first embodiment, it is possible to realize a MOSFET capable of reducing on-resistance. In addition, it is possible to realize a MOSFET capable of suppressing variation in avalanche resistance amount.

Second Embodiment

A semiconductor device according to a second embodiment is different from the semiconductor device according to the first embodiment from the point of view that, in the semiconductor device according to the second embodiment, the first thickness of the gate insulating layer between the gate electrode and the semiconductor layer is smaller than the second thickness of the gate insulating layer between the gate electrode and the metal region. In addition, the semiconductor device according to the second embodiment is different from the semiconductor device according to the first embodiment from the point of view that, in the semiconductor device according to the second embodiment, the width of the portion of the gate electrode facing the semiconductor layer in the second direction is larger than the width of the portion of the gate electrode facing the metal region in the second direction. Hereinafter, in some cases, a portion of contents overlapping with the semiconductor device according to the first embodiment may be omitted in description.

The semiconductor device according to the second embodiment is a vertical type transistor where a gate electrode is buried in a trench. The semiconductor device according to the second embodiment is a vertical type power MOSFET. The semiconductor device according to the second embodiment is a MOSFET 200.

Figure 8:
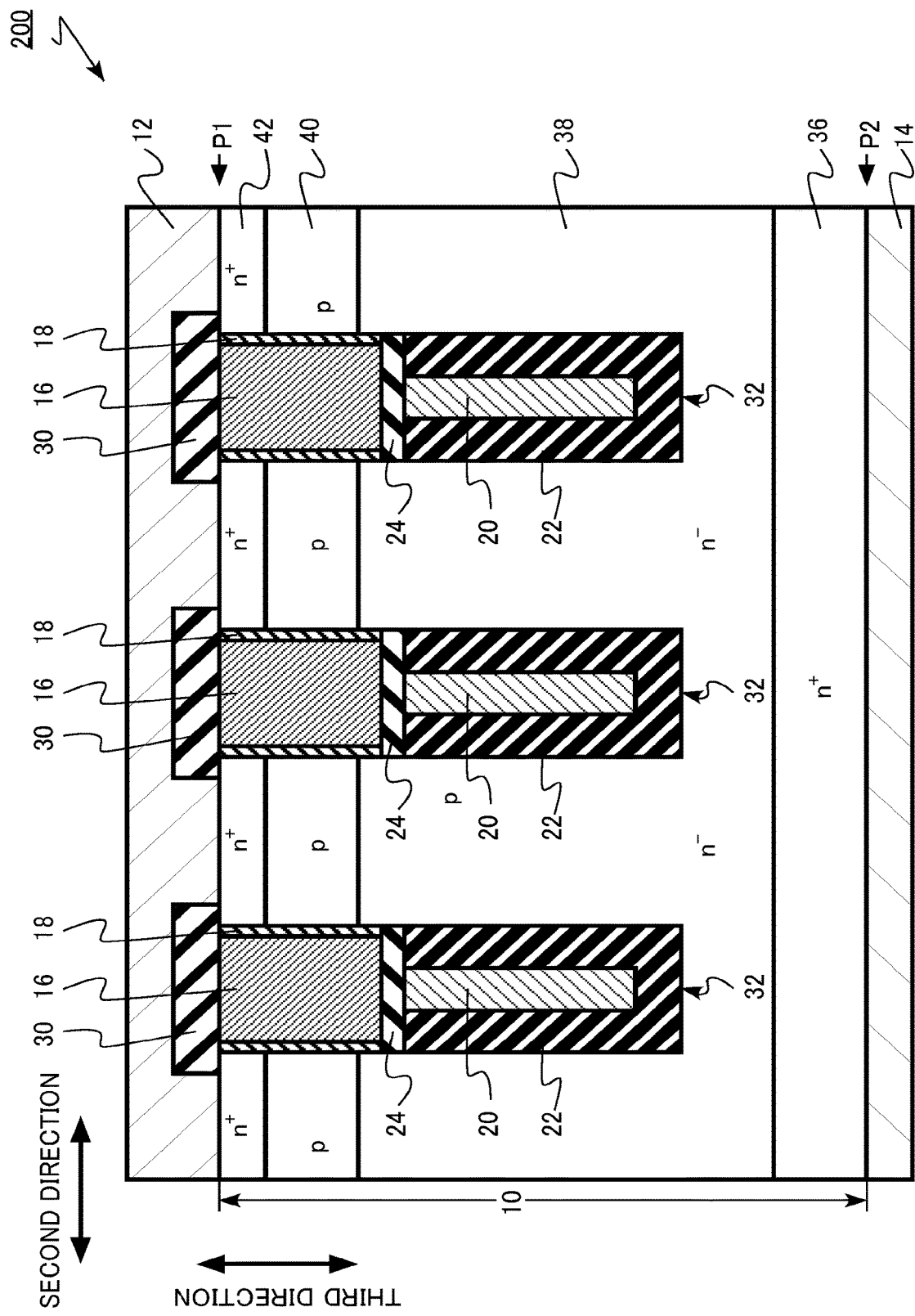
FIG. 8 is a schematic cross-sectional view of a semiconductor device according to a second embodiment.
Figure 9:
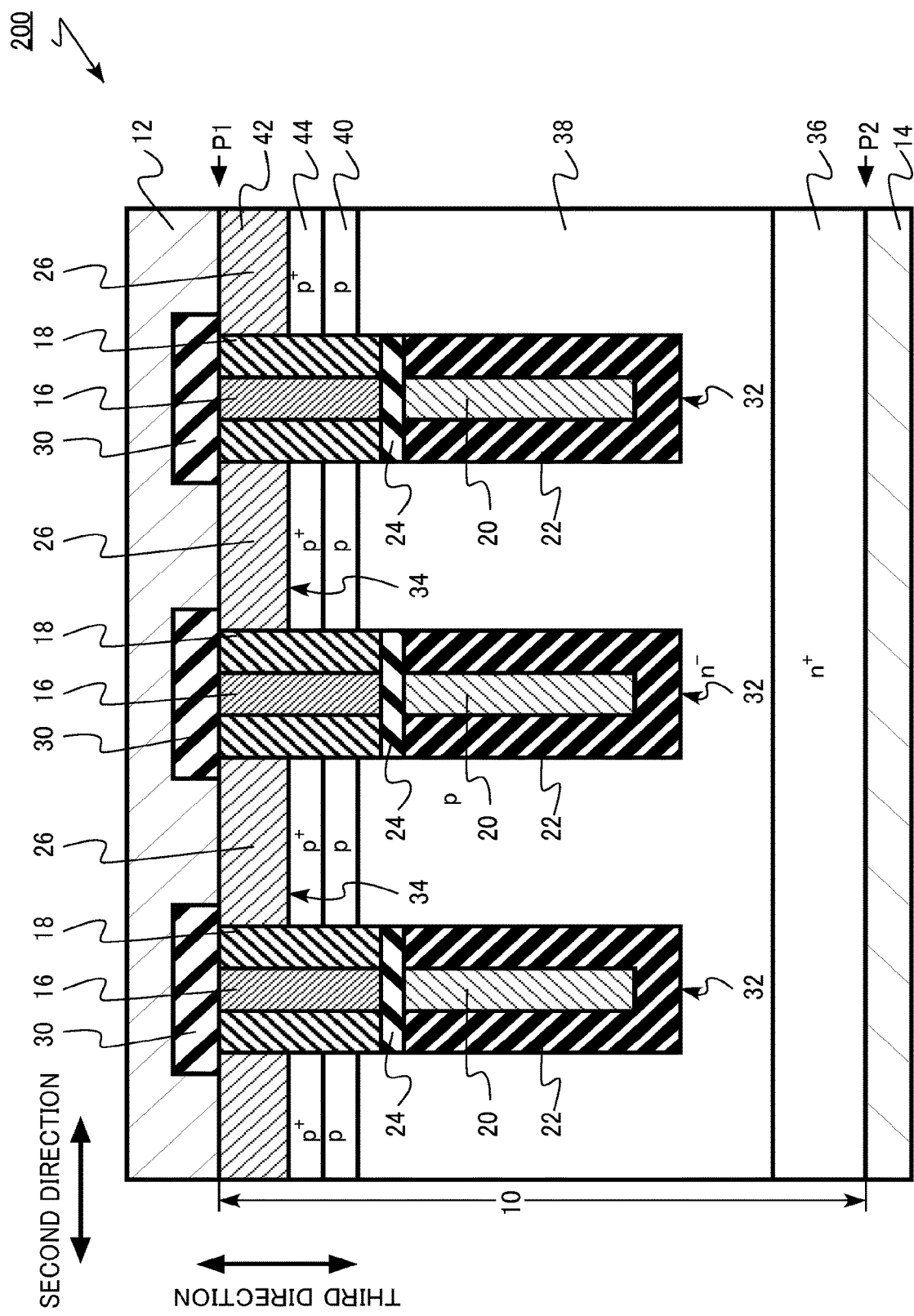
FIG. 9 is a schematic cross-sectional view of the semiconductor device according to a second embodiment.

FIGS. 8 and 9 are a schematic cross-sectional view of the semiconductor device according to the second embodiment. FIG. 8 is a view according to FIG. 2 of the first embodiment. FIG. 9 is a view according to FIG. 3 of the first embodiment.

Figure 10:
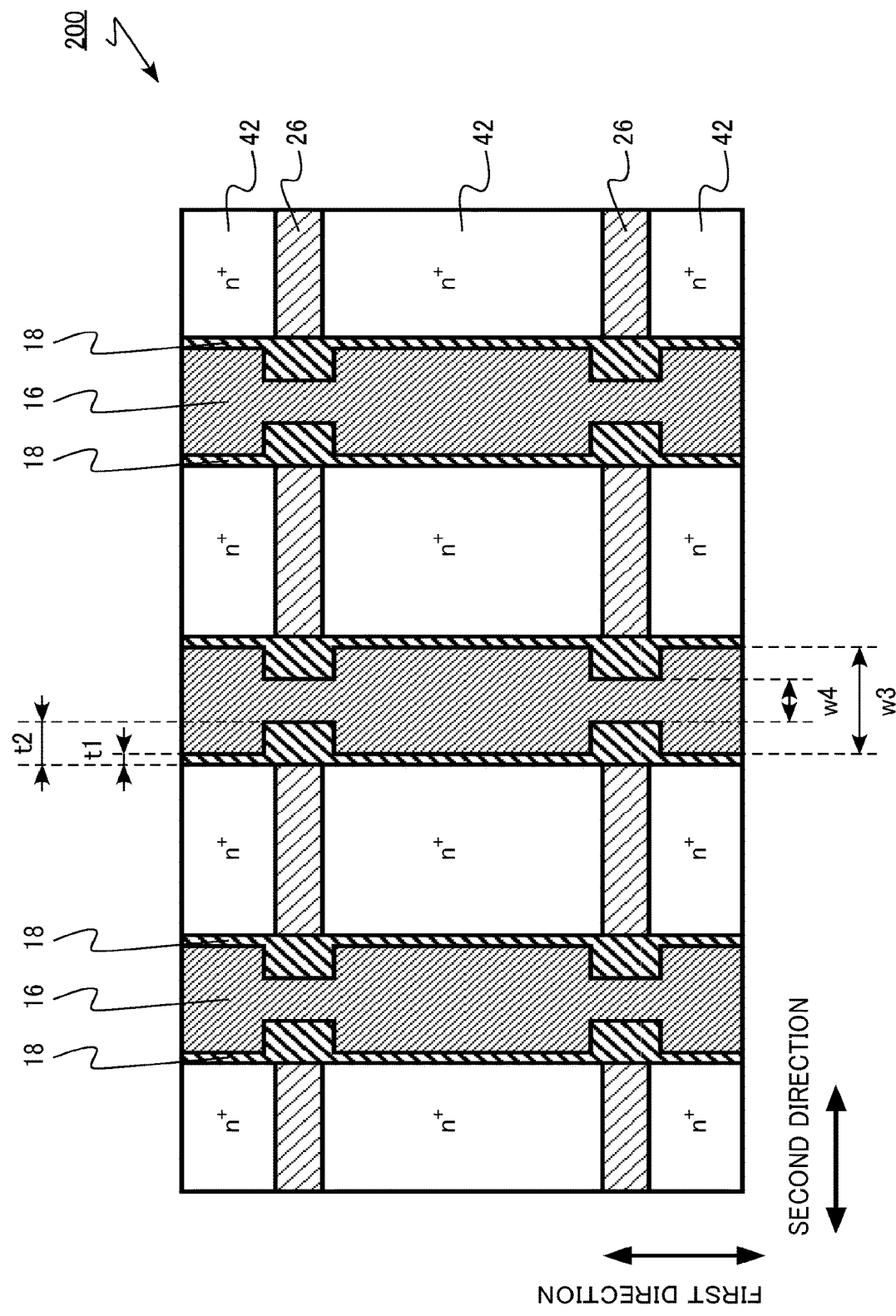
FIG. 10 is a schematic plan view of the semiconductor device according to the second embodiment.

FIG. 10 is a schematic plan view of the semiconductor device according to the second embodiment. FIG. 10 is a view according to FIG. 6 of the first embodiment.

The MOSFET 200 includes a silicon layer 10 (semiconductor layer), a source electrode 12 (first electrode) a drain electrode 14 (second electrode), a gate electrode 16, a gate insulating layer 18, a field plate electrode 20, a field plate insulating layer 22, an intermediate insulating layer 24, a contact electrode 26 (metal region), and an interlayer insulating layer 30.

The silicon layer 10 includes a gate trench 32 (first trench), a contact trench 34 (second trench), an $n^+$-type drain region 36, an $n^-$-type drift region 38 (first semiconductor region), a p-type body region 40 (second semiconductor region), an $n^+$-type source region 42 (third semiconductor region), and a $p^+$-type contact region 44 (fourth semiconductor region).

The gate insulating layer 18 of the MOSFET 200 has portions having different thicknesses in the second direction. The first thickness (t1 in FIG. 10) of the gate insulating layer 18 between the gate electrode 16 and the silicon layer 10 is smaller than the second thickness (t2 in FIG. 10) of the gate insulating layer 18 between the gate electrode 16 and the contact electrode 26. The second thickness t2 is, for example, 2 times or more and 10 times or less of the first thickness t1.

The gate electrode 16 of the MOSFET 200 has portions having different widths in the second direction. The width (w3 in FIG. 10) in the second direction of the portion facing the silicon layer 10 of the gate electrode 16 is larger than the width (w4 in FIG. 10) in the second direction of the portion facing the contact electrode 26 of the gate electrode 16. The gate electrode 16 is constricted in the region facing the contact electrode 26. The width w4 is, for example, 10% or more and 90% or less of the width w3.

In the MOSFET 200, the gate insulating layer 18 of the region where the gate trench 32 and the contact trench 34 intersect each other is thick. In addition, the gate electrode 16 of the region where the gate trench 32 and the contact trench 34 intersect each other is constricted.

The thickening the portion of the gate insulating layer 18 can be realized, for example, by selectively patterning the gate insulating layer 18 when forming the gate insulating layer 18. In addition, the constricting the portion of the gate electrode 16 can be realized, for example, by selectively patterning the gate electrode 16 when processing the gate electrode 16.

In the region where the gate trench 32 and the contact trench 34 intersect each other, the channel of the transistor is not formed in the body region 40. Therefore, even though the gate insulating layer 18 in this region is thick, there is no influence on the on-current of the transistor. In addition, even though the gate electrode 16 in this region is constricted, there is no influence on the on-current of the transistor.

On the other hand, by allowing the portion of the gate insulating layer 18 to be thick and allowing the portion of the gate electrode 16 to be constricted, the gate capacitance of the MOSFET 200 is reduced. Therefore, the switching loss of the MOSFET 200 is reduced.

From the point of view that the switching loss of the MOSFET 200 is reduced, the second thickness t2 is preferably 2 times or more, more preferably 3 times or more of the first thickness t1. In addition, from the point of view that the switching loss of the MOSFET 200 is reduced, the width w4 is preferably 90% or less, more preferably 70% or less, furthermore preferably 50% or less of the width w3.

As described above, according to the second embodiment, similarly to the first embodiment, it is possible to realize a MOSFET capable of reducing on-resistance. In addition, it is possible to realize a MOSFET capable of suppressing variation in avalanche resistance amount. In addition, it is possible to realize a MOSFET capable of reducing switching loss.

Third Embodiment

A semiconductor device according to a third embodiment is different from the semiconductor device according to the first embodiment from the point of view that, in the semiconductor device according to the third embodiment, the gate electrode has first and second regions separated from each other in the second direction in the first trench. Hereinafter, in some cases, a portion of contents overlapping with the semiconductor device according to the first embodiment may be omitted in description.

The semiconductor device according to the third embodiment is a vertical type transistor where a gate electrode is buried in a trench. The semiconductor device according to the third embodiment is a vertical type power MOSFET. The semiconductor device according to the third embodiment is a MOSFET 300.

Figure 11:
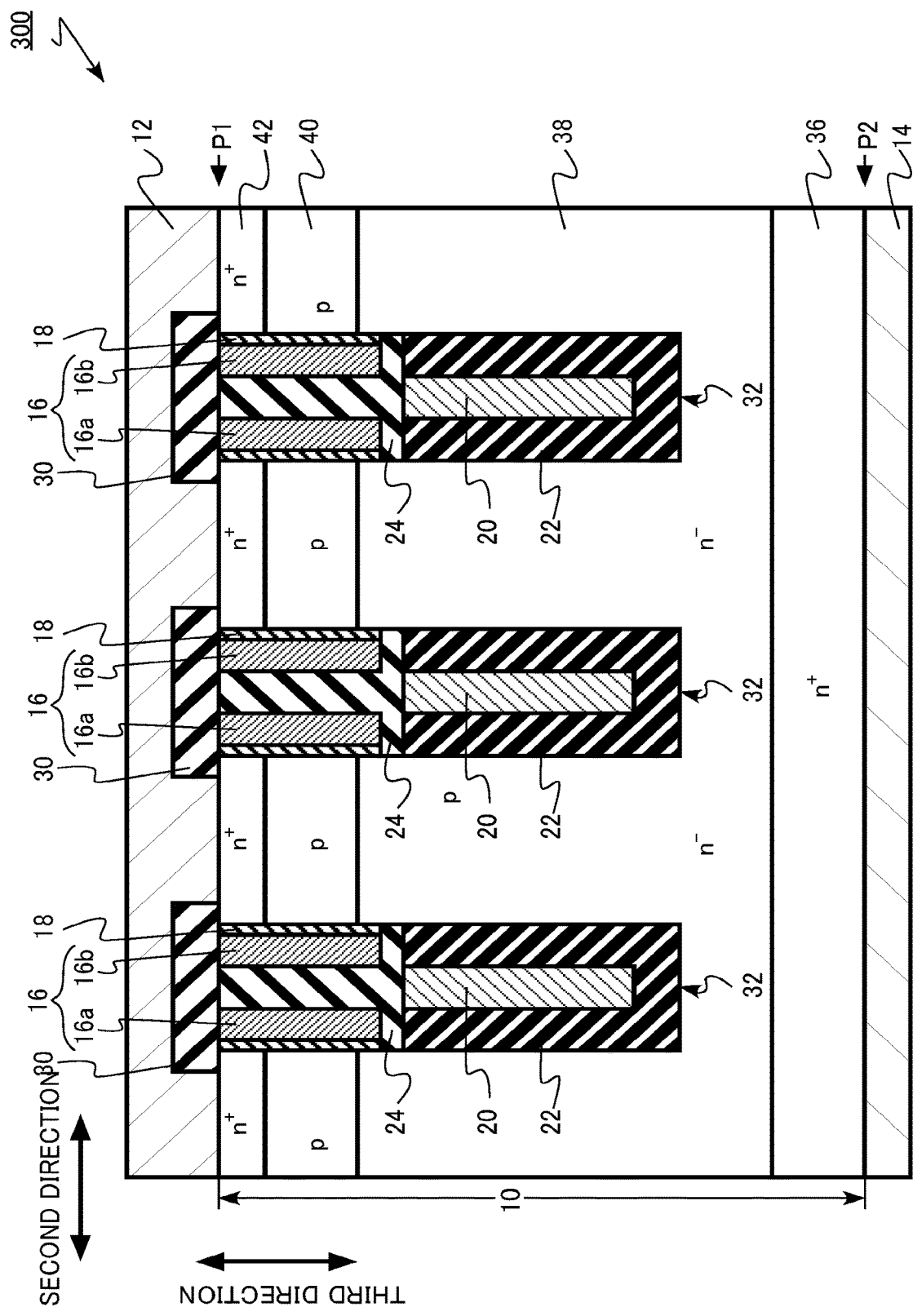
FIG. 11 is a schematic cross-sectional view of a semiconductor device according to a third embodiment.

FIG. 11 is a schematic cross-sectional view of the semiconductor device according to the third embodiment. FIG. 11 is a view according to FIG. 2 of the first embodiment.

Figure 12:
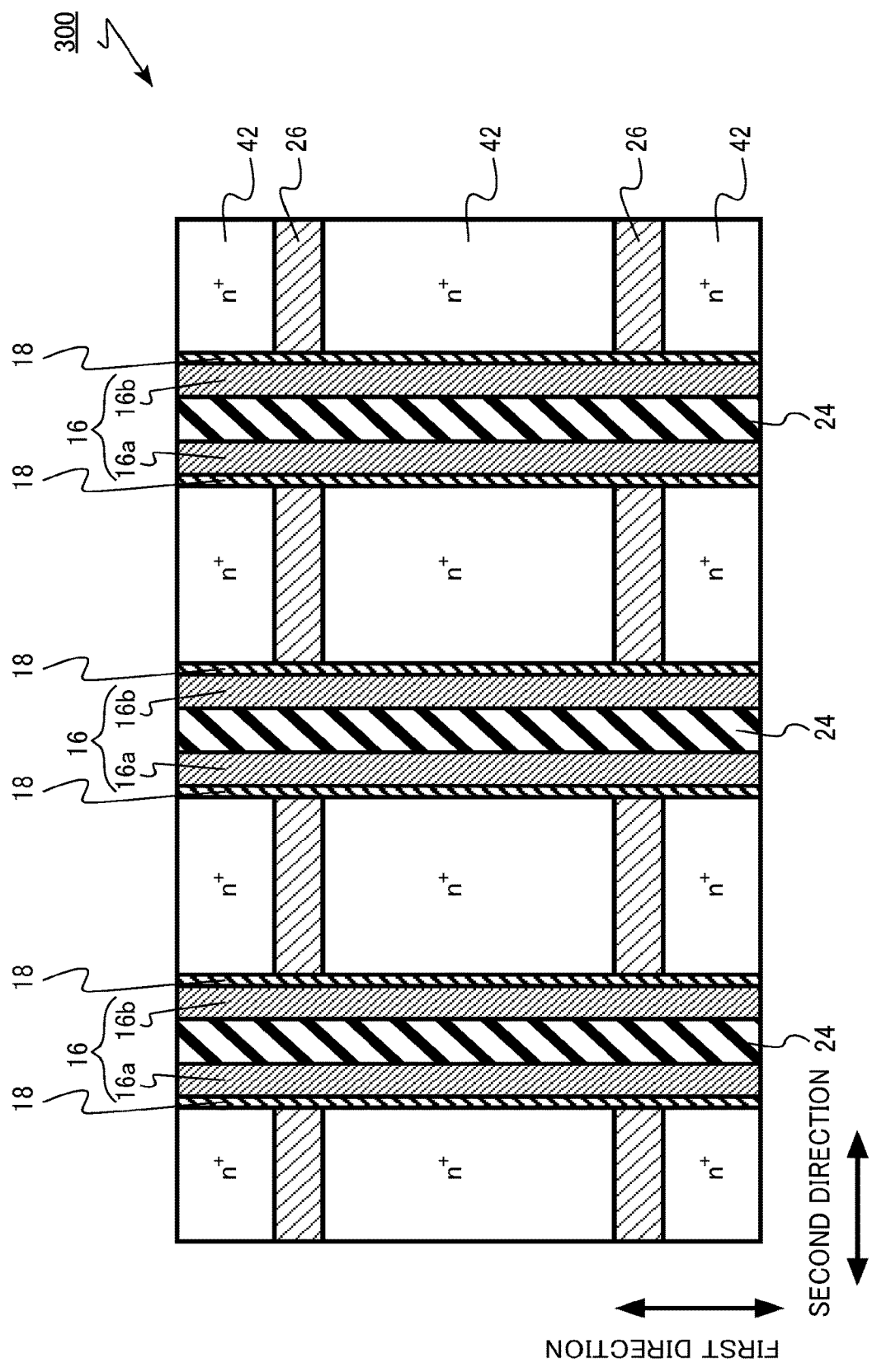
FIG. 12 is a schematic plan view of the semiconductor device according to the third embodiment.

FIG. 12 is a schematic plan view of the semiconductor device according to the third embodiment. FIG. 12 is a view according to FIG. 6 of the first embodiment.

The MOSFET 300 includes a silicon layer 10 (semiconductor layer), a source electrode 12 (first electrode), a drain electrode 14 (second electrode), a gate electrode 16, a gate insulating layer 18, a field plate electrode 20, a field plate insulating layer 22, an intermediate insulating layer 24, a contact electrode 26 (metal region), and an interlayer insulating layer 30. The gate electrode 16 has a first region 16a and a second region 16b.

The silicon layer 10 includes a gate trench 32 (first trench), a contact trench 34 (second trench), an n$^+$-type drain region 36, an n$^-$-type drift region 38 (first semiconductor region), a p-type body region 40 (second semiconductor region), an n$^+$-type source region 42 (third semiconductor region), and a p$^+$-type contact region 44 (fourth semiconductor region).

The gate electrode 16 has a first region 16a and a second region 16b. The first region 16a and the second region 16b are separated from each other in the second direction in the gate trench 32. The first region 16a and the second region 16b extend in the first direction. The first region 16a and the second region 16b are separated by the intermediate insulating layer 24.

The gate electrode 16 is separated into the first region 16a and the second region 16b, so that the gate capacitance of the MOSFET 300 is reduced. Therefore, the switching loss of the MOSFET 300 is reduced.

As described above, according to the third embodiment, similarly to the first embodiment, it is possible to realize a MOSFET capable of reducing on-resistance. In addition, it is possible to realize a MOSFET capable of suppressing variation in avalanche resistance amount. In addition, it is possible to realize a MOSFET capable of reducing switching loss.

As described above, in the first to third embodiments, a case where the first conductivity type is an n-type and the second conductivity type is a p-type has been described as an example, but the configuration where the first conductivity type is a p-type and the second conductivity type is an n-type can be employed.

In addition, in the first to third embodiments, a case where the semiconductor material is silicon has been described as an example, but silicon carbide (SiC), gallium nitride (GaN), or other semiconductor materials can be used.

While certain embodiments have been described, these embodiments have been presented by way of example only, and are not intended to limit the scope of the inventions. Indeed, semiconductor devices described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane and a second plane facing the first plane, the semiconductor layer including
a first trench located on a side closer to the first plane and extending in a first direction on the first plane,
a second trench located on the side closer to the first plane, extending in a second direction perpendicular to the first direction, and intersecting the first trench,
a first semiconductor region of a first conductivity type,
a second semiconductor region of a second conductivity type located between the first semiconductor region and the first plane, and
a third semiconductor region of the first conductivity type located between the second semiconductor region and the first plane;
a gate electrode located in the first trench;
a field plate electrode located between the gate electrode and the second plane in the first trench;
a metal region located in the second trench and electrically connected to the second semiconductor region;
a gate insulating layer located between the gate electrode and the semiconductor layer;
a field plate insulating layer located between the field plate electrode and the semiconductor layer;
a first electrode located on the side closer to the first plane and electrically connected to the third semiconductor region and the metal region; and
a second electrode located on a side closer to the second plane of the semiconductor layer.

2. The semiconductor device according to claim 1, wherein a first distance from the second plane to the first trench is smaller than a second distance from the second plane to the second trench.

3. The semiconductor device according to claim 2, wherein the second distance is larger than a third distance from the second plane to the second semiconductor region.

4. The semiconductor device according to claim 1, wherein the semiconductor layer includes a fourth semiconductor region provided between the second semiconductor region and the second trench and has a second conductivity type impurity concentration higher than a second conductivity type impurity concentration of the second semiconductor region.

5. The semiconductor device according to claim 4, wherein the fourth semiconductor region is in contact with the gate insulating layer.

6. The semiconductor device according to claim 4, wherein the metal region is in contact with the fourth semiconductor region on a bottom surface of the second trench.

7. The semiconductor device according to claim 6, wherein the metal region is in contact with the third semiconductor region on a side surface of the second trench.

8. The semiconductor device according to claim 1, wherein the metal region is a portion of the first electrode.

9. The semiconductor device according to claim 1, wherein a first width of the first trench in the second direction is larger than a second width of the second trench in the first direction.

10. The semiconductor device according to claim 1, wherein a first thickness of the gate insulating layer between the gate electrode and the semiconductor layer is smaller than a second thickness of the gate insulating layer between the gate electrode and the metal region.

11. The semiconductor device according to claim 10, wherein the second thickness is 2 times or more of the first thickness.

12. The semiconductor device according to claim 1, wherein a width of a portion facing the semiconductor layer of the gate electrode in the second direction is larger than a width of a portion facing the metal region of the gate electrode in the second direction.

13. The semiconductor device according to claim 1, wherein the gate electrode has a first region and a second region separated from each other in the second direction in the first trench.

14. The semiconductor device according to claim 1, wherein a thickness of the field plate insulating layer is larger than a thickness of the gate insulating layer.

15. The semiconductor device according to claim 1, wherein the semiconductor layer is made of silicon.

16. The semiconductor device according to claim 1, wherein the first conductivity type is an n-type.

* * * * *